United States Patent [19]
Andry

[11] Patent Number: 5,662,816
[45] Date of Patent: Sep. 2, 1997

[54] SIGNAL ISOLATING MICROWAVE SPLITTERS/COMBINERS

[75] Inventor: Steven C. Andry, Brooklyn, N.Y.

[73] Assignee: Lucent Technologies Inc., Murray Hill, N.J.

[21] Appl. No.: 566,817

[22] Filed: Dec. 4, 1995

[51] Int. Cl.⁶ .................................. B44C 1/22; C23F 1/00
[52] U.S. Cl. ............................... 216/18; 216/39; 361/748; 428/209; 428/901
[58] Field of Search .......................... 216/18, 33, 39, 216/41, 56, 78, 105; 428/131, 156, 209, 901; 361/748, 760, 761

[56] References Cited

U.S. PATENT DOCUMENTS 4,970,106 11/1990 DiStefano et al. ............... 216/18 X
5,567,330 10/1996 Dorothy ............................ 216/18

Primary Examiner—William Powell

[57] ABSTRACT

A microwave arrangement, such as a splitter and combiner, is formed by sandwiching a conductive ground plane between two dielectric microstrip boards whose outer faces carry RF traces and extending the ground plane with a conductive plurality of distributed via holes that contact the ground plane and pass through the boards to their outer faces. Connections are made between the traces on the surfaces with additional conductive via holes that pass through the ground plane where the ground plane forms openings for passage of the via holes.

20 Claims, 14 Drawing Sheets

SIGNAL ISOLATING MICROWAVE SPLITTERS/COMBINERS

FIELD OF THE INVENTION

This invention relates to apparatuses for handling microwave signals and manufacture of such apparatuses, and particularly to signal isolating microwave splitter/combiners or divider/combiners.

BACKGROUND OF THE INVENTION

In an article entitled "A New N-Way Power Divider/Combiner Suitable for High Power Applications", published in the MTT Symposium Digest, 1975, pp. 116–118, the author, Ulrich H. Gysel, discloses a microwave circuit (assumed to be a combiner circuit), which avoids the presence of extraneous signals that may flow reversely through ports and averts other detrimental electrical effects. The microwave circuit includes circuit boards and transmission lines which are all in the form of strip lines printed on such boards except that one such line is a coaxial line. In such a circuit, a primary port is connected by a coaxial line Z1 to a Junction to which are also connected a number of strip lines Z2 connected at their ends away from such junction to such corresponding secondary ports. The lines Z2 provide principal paths for transfer of microwave signals between the secondary ports and the mentioned junction.

In order for a signal received at any one secondary port to reach, through principal paths, any other secondary port as an extraneous signal, that signal must travel through two principal paths, a distance between those two ports, which is a half wavelength of the microwave signal at the mid frequency of the combiner. Such extraneous signal undergoes approximately a 180° phase shift in the course of such travel. The author reduces the presence of such extraneous signals at the secondary ports by respectively connecting these ports to a number of supplemental signal transfer paths, each composed of a strip line Z3 and a strip line Z4 in series, and all connected to a common floating point at their ends away from the secondary ports. Each such supplemental path has a length of one half wavelength. This causes extraneous signals to pass through not only two principal paths but also through two supplemental paths. The fraction of the signal which travels through the supplemental paths to the destination port undergoes a phase shift of 360° and becomes exactly out of phase with the fraction of the extraneous signal reaching the port through the two principal paths. These two signal fractions then cancel each other so as to reduce the resulting extraneous signals to low levels.

The Gysel arrangement exhibits the disadvantage of requiring several impedance coaxial transmission lines.

SUMMARY OF THE INVENTION

An embodiment of the invention involves sandwiching a conductive ground plane between two dielectric microstrip boards whose outer faces carry RF traces, and extending the effect of the ground plane with a plurality of distributed, conductive via holes that contact the ground plane and pass through the boards to their outer faces.

Connections between the traces on the surfaces are made with additional conductive via holes that pass through the boards and through the ground plane where the ground plane forms openings for passage of the via holes.

The various aspects that characterize the invention are pointed out in the claims forming a part of this specification. The advantages of the invention will become evident from the following detailed description when read in light of the accompanying drawings.

DETAILED DESCRIPTION OF PREFERRED EMBODIMENTS

Figure 1:
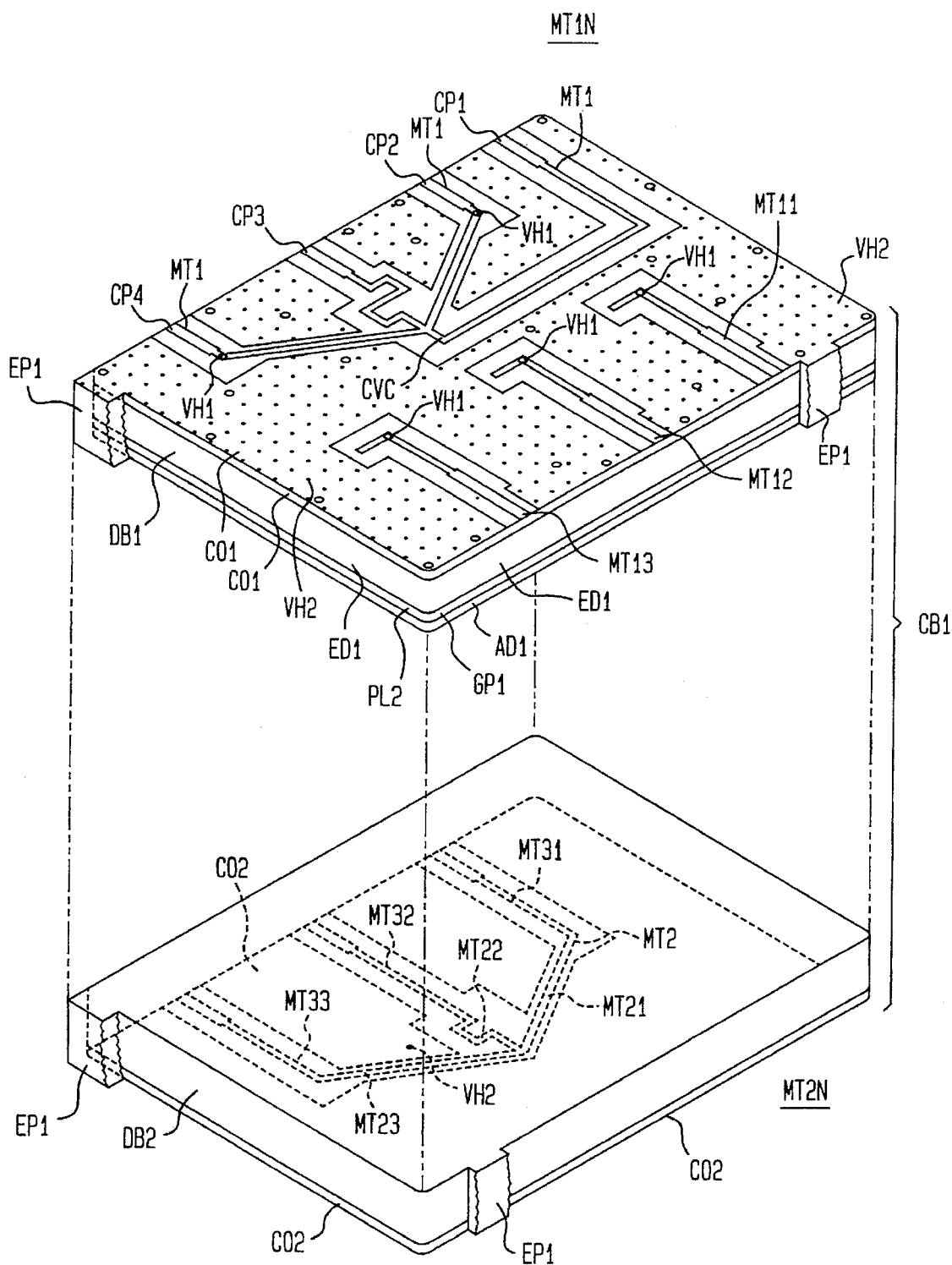
FIG. 1 is exploded perspective view of an embodiment of the invention.
Figure 2:
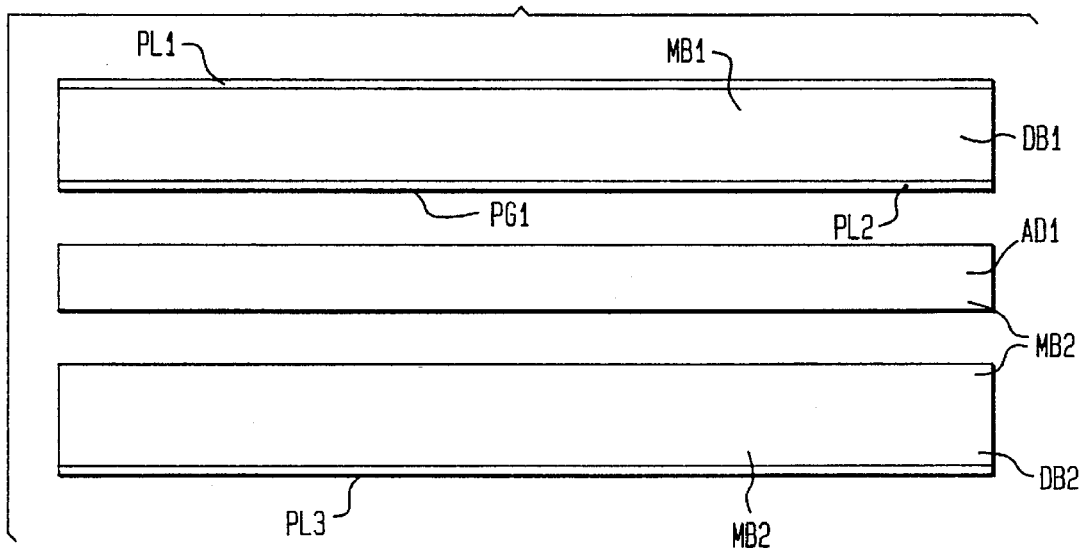
FIG. 2 is an exploded elevational view of an edge of the embodiment in FIG. 1 during its manufacture.

FIG. 1 is an exploded perspective view of an embodiment of the invention in the form of a composite printed circuit board CB1 and constituting a divider/combiner DC1. FIG. 2 is an exploded elevation of elements from which manufacture of the board CB1 starts.

In FIG. 2 manufacture of the composite printed circuit board CB1 begins with a dielectric board DB1 having conductive (e.g. copper) platings PL1 and PL2 covering the respective upper and lower surfaces of the board DB1. A second dielectric board DB2 has a lower surface on which is plated with conductive plating PL3. The second board DB2 may actually originate with platings on both the upper an lower surfaces and then have the upper surface plating removed. The dielectric constant of the board DB1 is $\epsilon_{r1}$ and that of the board DB2 is $\epsilon_{r2}$, and in one embodiment $\epsilon_{r1}=\epsilon_{r2}$. The dielectric constant of the adhesive AD1 is $\epsilon_{r3}$ and in one embodiment may be equal to $\epsilon_{r1}=\epsilon_{r2}$. The thicknesses of the layers in FIGS. 1 and 2, and particularly the adhesive layer AD1, are substantially exaggerated in different degrees for clarity. Thicknesses of the boards DB1 and DB2 may be equal or unequal as needed for a particular application.

The platings PL1, PL2, and PL3 are then etched. Thereafter, an adhesive AD1 is used to secure the unplated upper surface of the board DB2 to the etched lower plating PL2. Holes are then drilled through the plated and etched boards and the adhesive and the holes are plated. The dielectric board DB1 and the etched plating PL1 form a microstrip board MB1 and the dielectric board DB2 and the etched plating PL3 form a microstrip board MB2. The etched plating PL2 forms a conductive ground plane PG1. The result is the composite board CB1 as shown in FIG. 1.

In FIG. 1 the upper microstrip board MB1 and the lower microstrip board MB2 sandwich the conductive common ground plane GP1 between them. The common ground plane GP1 is plated onto the upper dielectric board DB1 and an adhesive layer AD1 secures the lower dielectric board DB2 onto the common ground plane GP1.

As shown in FIG. 1, the microstrip board MB1 contains conductive microstrip traces MT1, MT11, MT12, and MT13 (etched remains of the plating PL1 and collectively referred to as MT1N for simplicity) on the upper surface of the dielectric board DB1. Microstrip board MB2 contains microstrip traces MT2, MT21, MT22, MT23, MT31, MT32, and MT33 (also etched remains of the plating PL3 and collectively referred to as MT2N for simplicity) on the lower surface of the dielectric board DB2. Dielectrically spaced from the traces MT1N and MT2N, are respective conductive platings CO1 and CO2 on the upper surface of the board DB1 and the lower surface of the board DB2. The conductive platings CO1 and CO2 are also etched remains of the platings PL1 and PL3.

Figure 3:
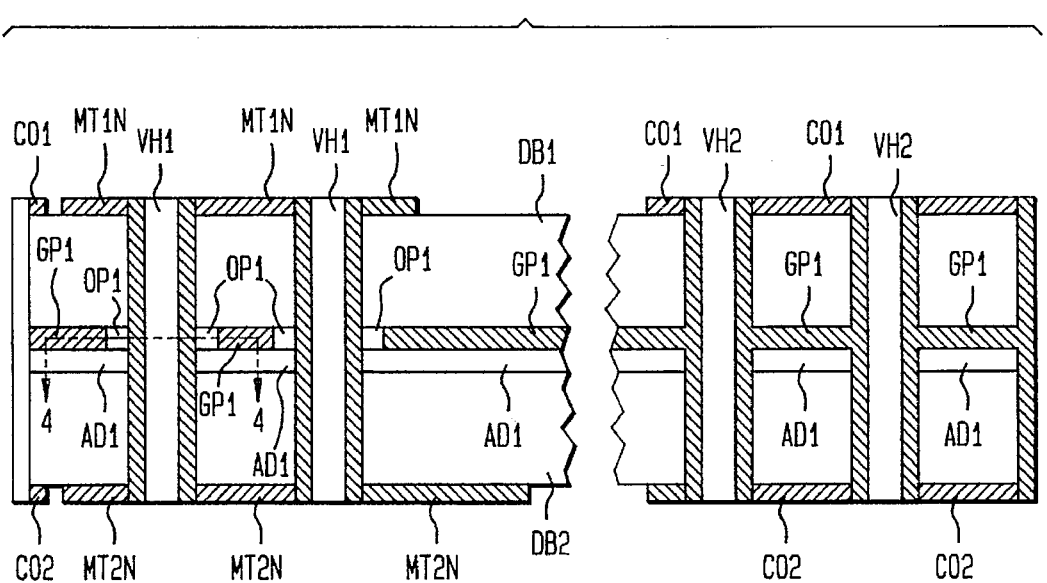
FIG. 3 is a sectional view of details of the embodiment shown in FIG. 1.
Figure 4:
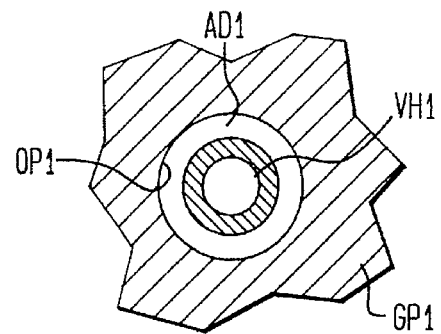
FIG. 4 is an expanded view of a portion of FIG. 3, particularly showing passage of a via hole through the ground plane for connection of the traces on the surfaces.

Plated-through, conductive, RF trace via holes VH1 connect specific points of the traces MT1N at the top of the microstrip board MB1 with specific points of the microstrip traces MT2N at the bottom of microstrip board MB2. The via holes VH1 appear more clearly FIG. 3 which is an elevational cross-section of a portion of FIG. 2, and in FIG. 4 which is the plan cross-section 4—4 of FIG. 3. FIG. 4 is a magnified view of a portion of the ground plane GP1 in the vicinity of a via hole VH1. In FIGS. 3 and 4 the conductive via holes VH1 connect the conductive traces MT1N at the top of the microstrip board MB1 to the microstrip traces MT2N at the bottom of microstrip board MB2. As shown in FIGS. 3 and 4, openings OP1 in the ground plane GP1 allow passage of the conductive plating on the via holes VH1 from the microstrip traces MT1N to the microstrip traces MT2N without shorting to the ground plane GP1. In FIG. 4, the opening OP1 exposes the adhesive layer AD1 which overlies the dielectric board DB2 (not shown in FIG. 4.). The conductive material, for example copper, of the common ground plane GP1 forms each opening OP1 for passage of the plated-through via hole VH1.

As shown in the details of FIG. 3, plated-through ground via holes VH2 pass from the conductive plating CO1 on the upper surface of the microstrip board MB1 to the ground plane GP1 and continue to the conductive platings CO2 on the underside of the microstrip board MB2. All via holes VH2 are electrically connected by plating to the ground plane GP1. The ground via holes VH2 appear at closely spaced points unoccupied by traces MT1N and MT2N and form honeycombs that extend the ground plane GP1 through the boards DB1 and DB2. In this way the via holes VH2 carry the ground potential to the platings CO1 and CO2 around the microstrip traces MT1N and MT2N and in effect form ground-potential shields around the traces. The via holes VH1 provide for RF signal power transfer from the traces MT1N on the top microstrip board MB1 to the traces MT2N on the bottom microstrip board MB2.

According to an embodiment of the invention (not shown) some or all of the via holes VH2 pass only to and not beyond the ground plane GP1. Rather, some extend through the board DB1 and terminate in connection with the ground plane GP1 and others extend through the board DB2 and also connect to the ground plane GP1. Those passing through the board DB1 may be offset from those passing through the board DB2.

Figure 4A:
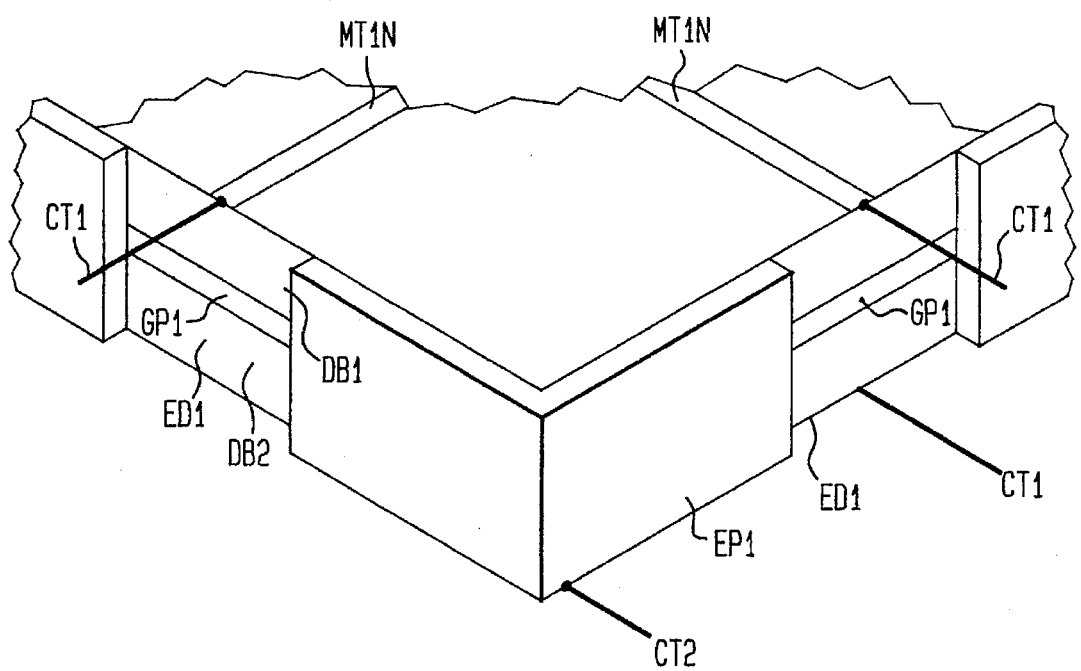
FIG. 4A is a perspective view of another embodiment of the invention showing conductive plating on the edges of the device in FIG. 1.
Figure 5:
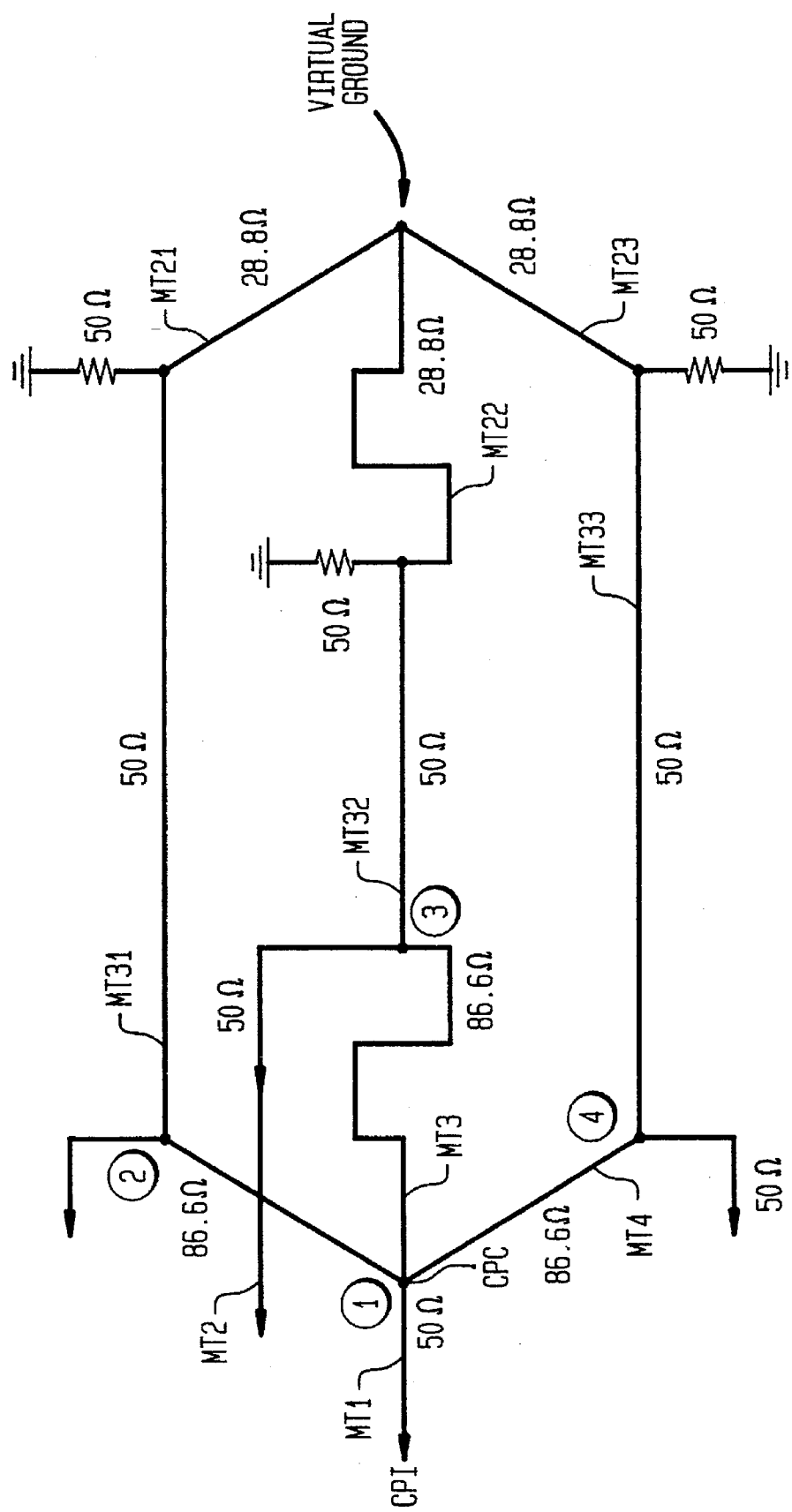
FIG. 5 is an equivalent circuit of the device in FIGS. 1.

As shown in FIGS. 1, 3, and 5, the plated conductor CO1 on the upper surface of the board BO1 connects all via holes VH2 to edge plating EP1 on an edge ED1 of the board MB1, and the plated conductors CO2 on the lower surface of the board MB2 connects all via holes VH2 to the edge plating EP1 on the same edge of the board MB2. The platings EP1 on the edges ED1 of the dielectric boards DB1 and DB2 of FIGS. 1 and 2 connect to the ground plane GP1 and carry the electric ground potential along the edges. As shown in FIG. 4A, conductors CT1 connect the microstrip traces MT1N and MT2N to suitable sources and loads. Conductors CT2 connect the conductors CO1 and CO2, and hence the via holes VH2 as well as the ground plane GP1 to an external ground, such as a casing CA1 illustrated in FIG. 7. The platings EP1 are shown only partially in FIG. 1. According to an embodiment of the invention, the platings EP1 extend along the entire lengths of each off the edges of the boards BO1 and BO2 with gaps only for the traces MT1N and MT2N.

The traces MT1 and MT2 and the via holes VH1 of FIGS. 1 to 4 (including 4A) form the circuit of an N-way combiner/divider. In the example of FIGS. 1 to 4, N=3. The equivalent circuit schematic of the example of FIGS. 1 to 4 appears in FIG. 5. Details of this circuit are described with respect to FIGS. 8 and 9. (Terms such as FIGS. 1 to 4 and 1 to 5 are intended to include FIG. 4A.)

Figure 6:
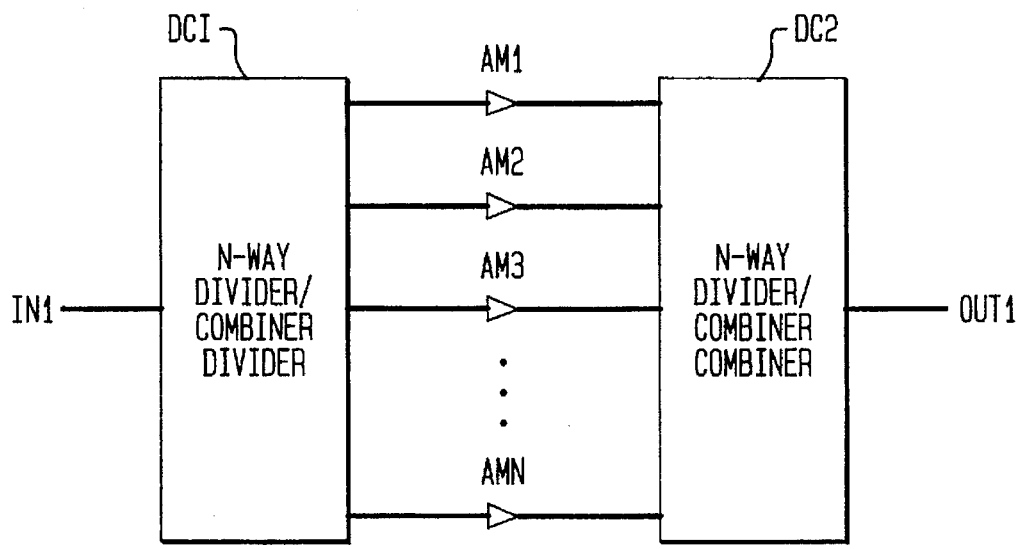
FIG. 6 illustrates an embodiment of the invention in the form of a system utilizing divider/combiners in FIG. 1.

FIG. 6 is a block diagram of a system embodying the invention. Here, N-way divider/combiners DC1 and DC2 serve to parallel high-power amplifiers with coherent signals. To do this, the divider/combiner DC1 operates as a divider and receives an input signal. The divider/combiner DC1 then distributes the output among N lines to amplifiers AM1, AM2, AM3 ... AMN. The N-way divider/combiner DC2, which is identical to the divider/combiner DC1, uses its combiner function to produce a single output from the parallel high-power amplifiers AM1 to AMN. Each of the divider/combiners DC1 and DC2 embodies aspects of the invention. For example the divider/combiners are each the type shown in FIGS. 1 to 5.

Figure 7:
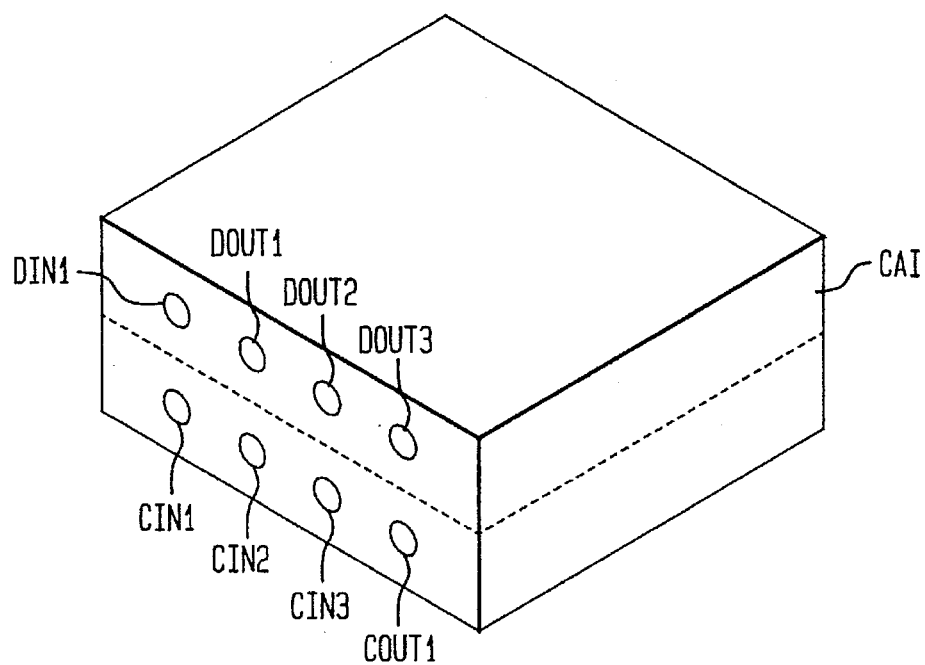
FIG. 7 is a perspective view of the device in FIG. 6, showing input and output ports.

FIG. 7 illustrates an example of a structure encasing the divider/combiner DC1 or divider/combiner DC2. Here, the grounded casing CA1 contains the two divider/combiner and the value N=3. Connectors (not shown) connect to the internal divider/combiner boards CB1. The boards CB1 in the casing CA1 provide inputs and outputs. For example, if the top board within the casing CA1 serves as a divider, an input appears at the upper connector DIN1 and outputs appear at the upper connectors DOUT1, DOUT2, and DOUT3 of the divider/combiner. If the lower board is used as a combiner, inputs appear at connector CIN1, CIN2, and CIN3 and an output appears at connector COUT1.

Figure 8:
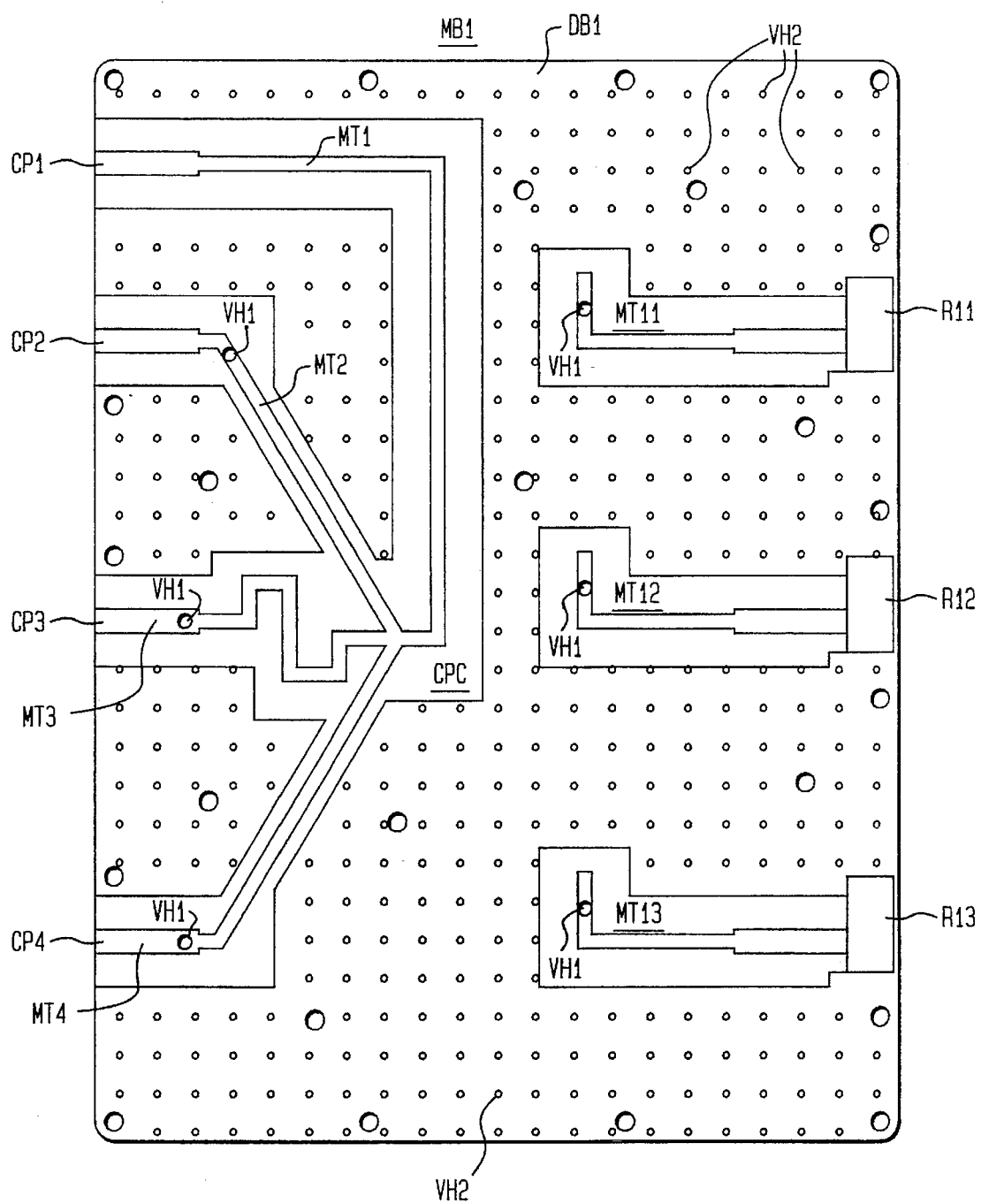
FIG. 8 is a detailed view of the top board for a three-way combiner/divider, showing RF traces.

FIG. 8 is a top view of the microstrip board MB1. Here, microstrip traces MT1, MT2, MT3 and MT4 start at respective connector points CP1, CP2, CP3, and CP4 and merge at a common connector point CPC. Microstrip traces MT11, MT12, and MT13 connect to terminating resistors R11, R12, and R13 which may or may not be part of the board MB1. Conductive plated ground via holes VH2 form a honeycomb of conductors through the dielectric board DB1 of the microstrip board MB1.

Figure 9:
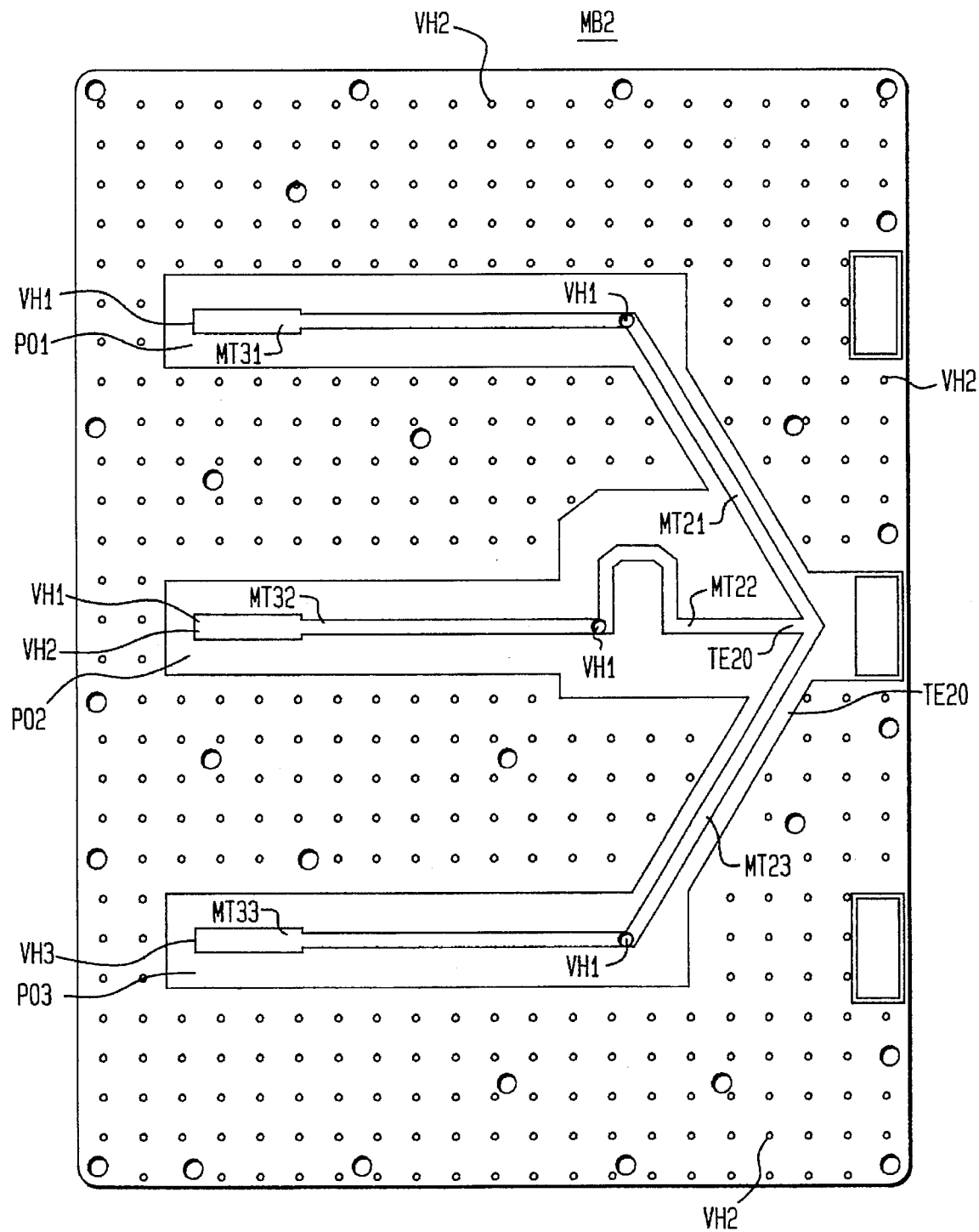
FIG. 9 illustrates a bottom view of a bottom board of a three-way combiner/divider.

FIG. 9 illustrates a bottom view of the microstrip board MB2. Here, microstrip traces MT21, MT22, and MT23 which meet at a terminal TE20 and microstrip traces MT31, MT32, and MT33 which connect the traces MT21, MT22, and MT23 respectively to trace via holes VH1 that pass through the board DB1 to corresponding via holes VH1 shown in FIG. 8. Similarly, trace via holes VH1 at the junctures of the traces MT21 and MT31, the traces MT22 and MT32, and the traces MT23 and MT33, connect to power via holes VH1 at the ends of traces MT11, MT12, and MT13 shown in FIG. 8. The traces MT3 and MT22 contain curves to lengthen them for the purpose of producing desired phase displacements.

Figure 10:
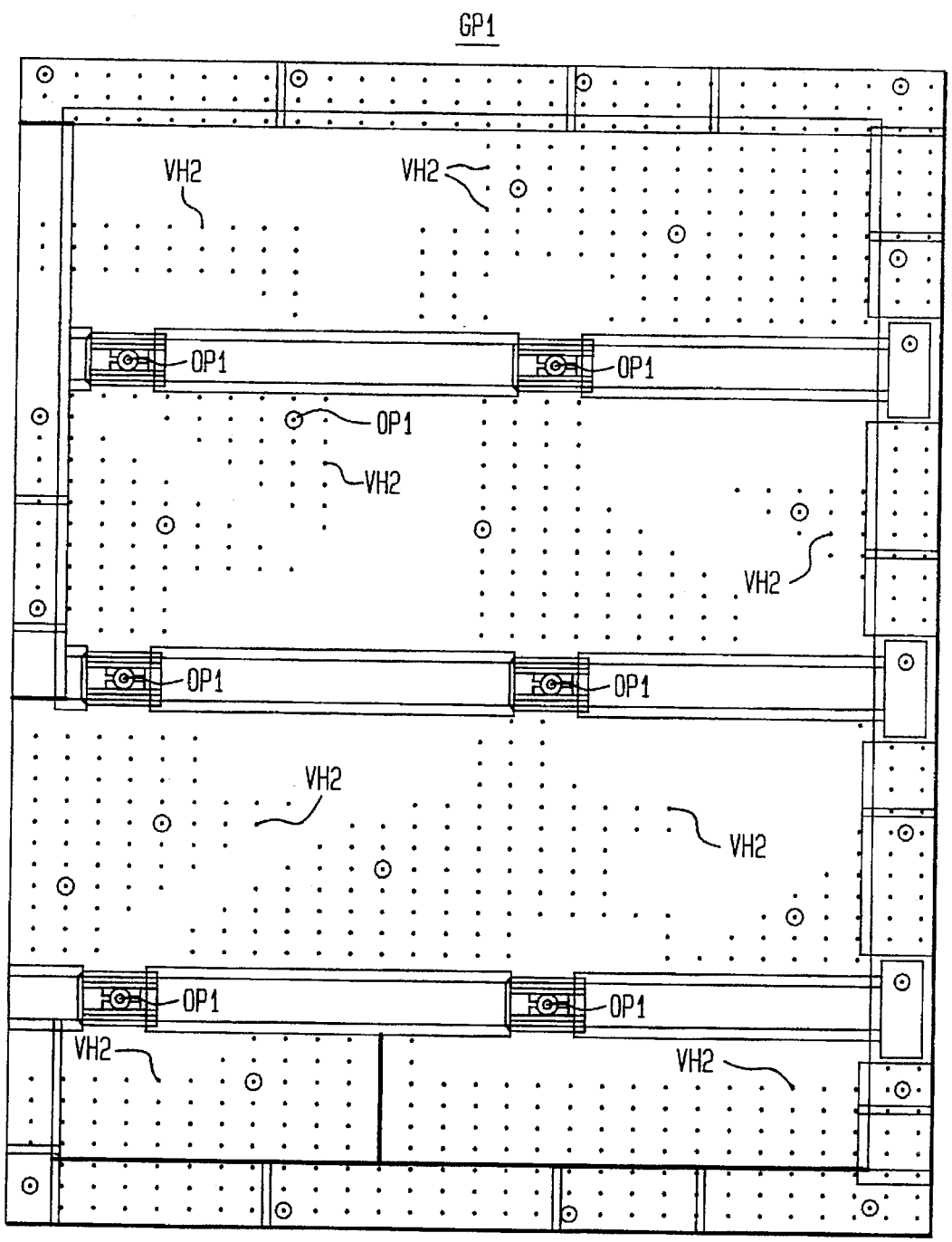
FIG. 10 is a plan view of the ground plane of the top board in a combiner/divider such as that of FIGS. 1.

FIG. 10 illustrates the ground plane GP1. The ground via holes VH2 from the top of the board DB1 through to the bottom Of the board DB2 connect at the ground plane. Openings OP1 allow passage of the trace via holes VH1 from the traces on the board DB1 to the traces on the board DB2 for the purpose of producing desired RF signal power transfer from the traces MT1N on the top microstrip board MB1 to the traces MT2N on the bottom microstrip board MB2.

The traces in FIGS. 1, 8, 9, and 10 and the trace via holes VH1 form the circuit shown in FIG. 5. The trace MT1 of FIG. 8 is a 50 ohm line to the connecting point CP1. It represents input to the device of FIG. 1 as a divider. An input to the point CP1 arrives at the point CPC and divides into three directions through three microstrip traces MT2, MT3, and MT4, each 86.6 ohms. The structure in FIGS. 1 to 5, 8, 9, and 10 represents an N-way divider/combiner which here is a three-way divider/combiner. That is, here N=3.

The value 86.6 represents 50 times the square root of N, where here N=3. Trace via holes VH1 at the ends of traces MT2, MT3, and MT4 pass the signals VH1 at points identified as 2, 3, and 4 through openings OP1 in the ground plane GP1 to 50-ohm to traces MT31, MT32, and MT33 at points identified as PO1, PO2, and PO3 in FIG. 9. The traces MT31, MT32, and MT33 pass the signals to traces MT21, MT22, and MT23, all of which are 28.8 ohms or 50 divided by the square root of N, where N=3. The traces MT21, MT22, and MT23 meet at a terminal TE20, which forms a virtual ground. The trace MT22 follows a curved path to preserve phase displacement. Conductive trace via holes VH1 at the confluence of traces MT21 and MT31, the confluence of MT22 and MT32, and the confluence of traces MT23 and MT33 pass the signals at that point back through the ground plane GP1 to traces MT11, MT12, and MT13 to 50-ohm resistance termination to ground.

When it operates as a divider, the divider/combiner DC1 of FIGS. 1, to 5, and 8 to 10 operates as follows. Signals entering the trace MT1 are delayed one-quarter wavelength at the separate ends of traces MT2, MT3, and MT4, namely points 2, 3, and 4, and exit from those points. However, the signals at the points 2, 3, 4 are also connected to each other and may cause extraneous signals. The connection between each of the points 2, 3, and 4 is in each case twice one-quarter wavelength or half a wavelength. The traces MT31, MT32, and MT33 each in series with respective traces MT21, MT22, and MT23, each forms a half wavelength delay, and the signals must pass through two of these series connected paths, for a total of a four wavelength delay. Hence the extraneous signals are 180° out of phase with those at the points 2, 3, and 4 and therefore cancel the extraneous signals. On the other hand, the main signals are 90° out of phase with the 360° return phase signals and are unaffected thereby.

When the arrangement of FIGS. 1 to 4 and 8 to 10 operates as a combiner, signals appear at the points 2, 3, and 4 at the end of traces MT2, MT3, and MT4. The traces MT2, MT3, and MT4 combine the signals at the trace MT1 and produce an output at the connecting point CP1. The signals at the points 2, 3, and 4 can interfere with each other by producing extraneous signals. These points 2, 3, and 4 are separated from each other by one-half wavelength each. The full wavelength travel of extraneous signals through the supplemental path MT31 and MT21, MT32, and MT22, and MT33 and MT23 shifts the phase 360° and cancels the extraneous signals at the connecting points 2, 3, and 4.

Figure 11:
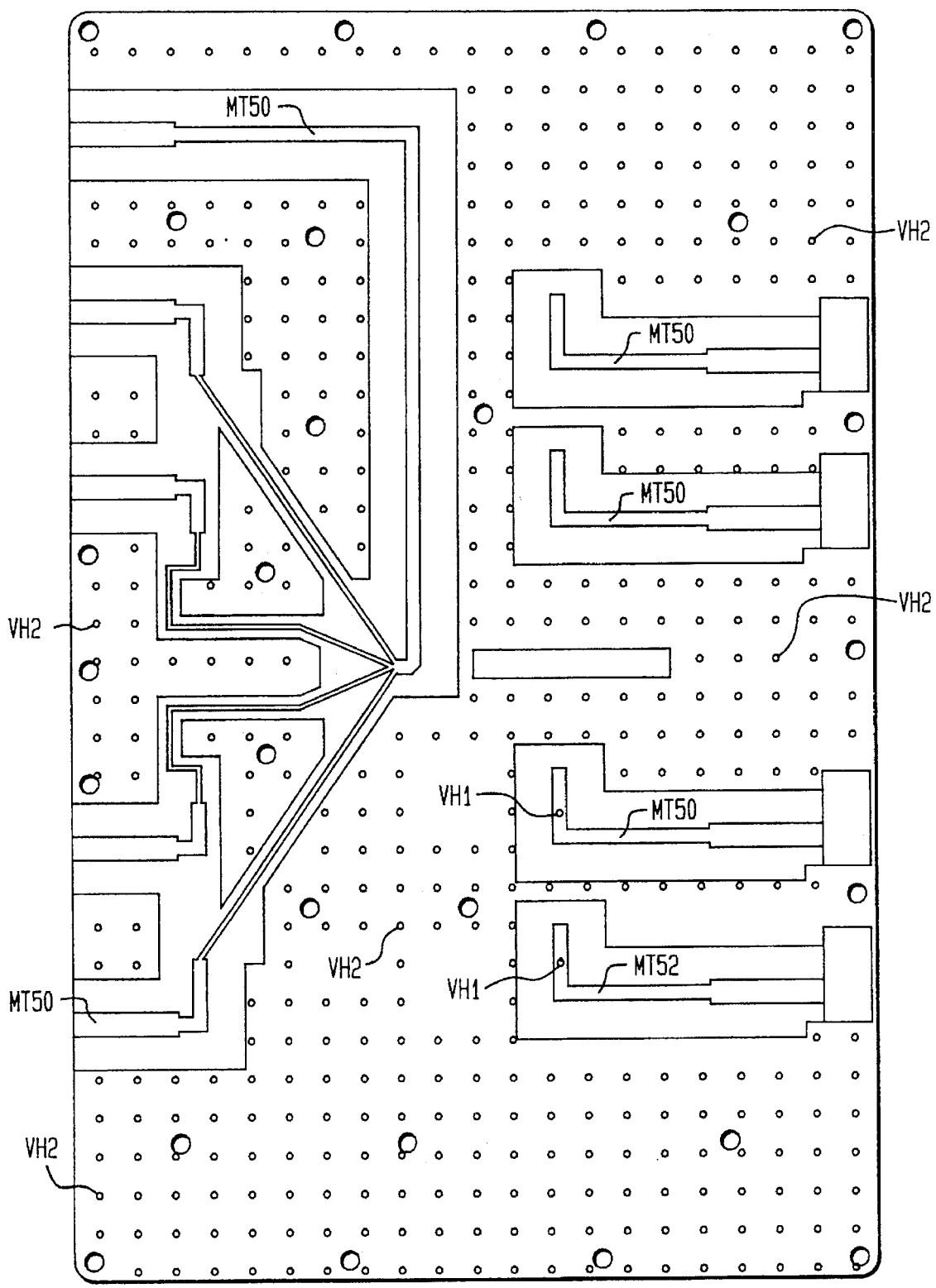
FIG. 11 is a plan view showing the RF traces and via holes of a four way combiner/divider.
Figure 12:
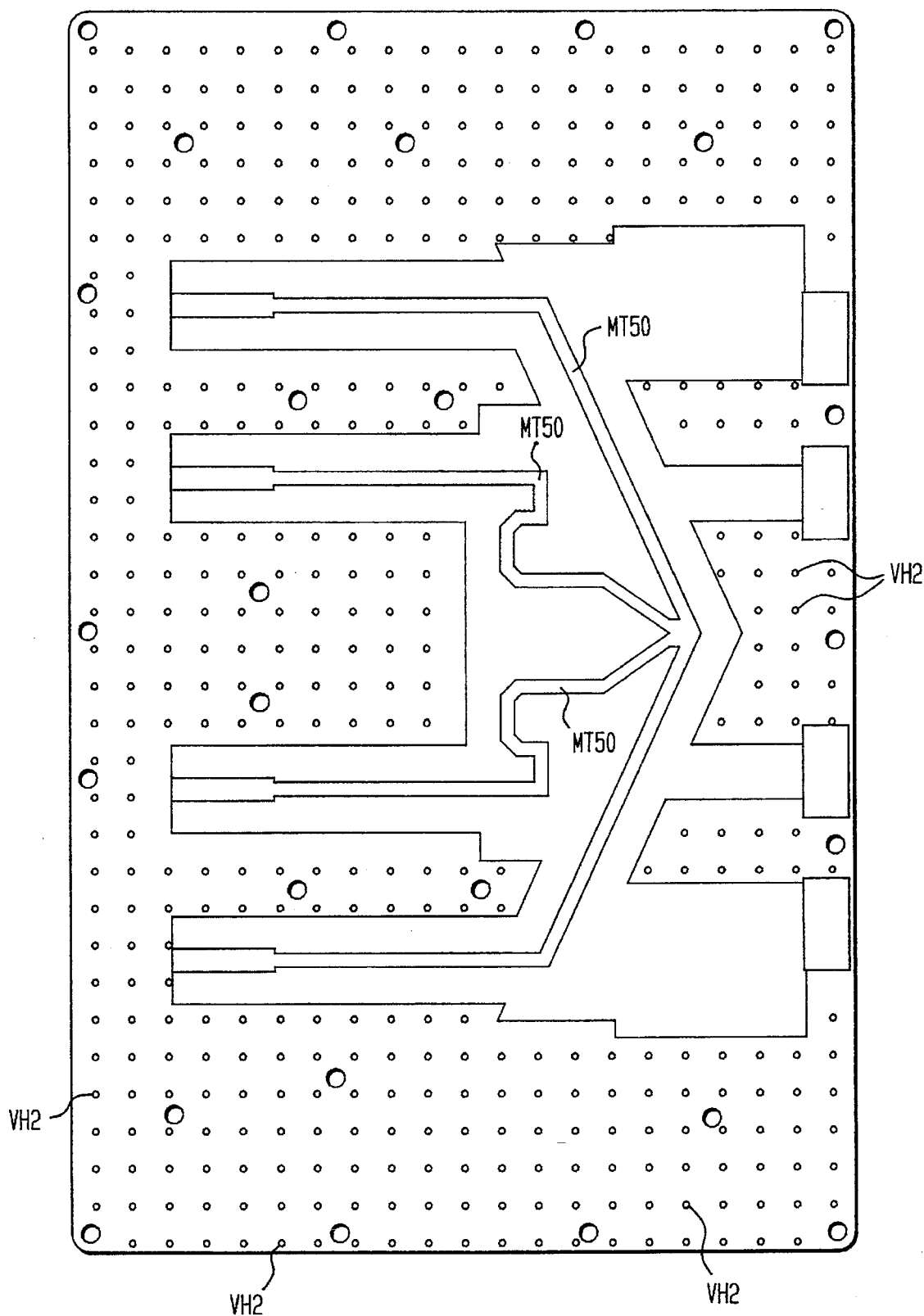
FIG. 12 is a bottom view of the bottom board of the device in FIG. 11.
Figure 13:
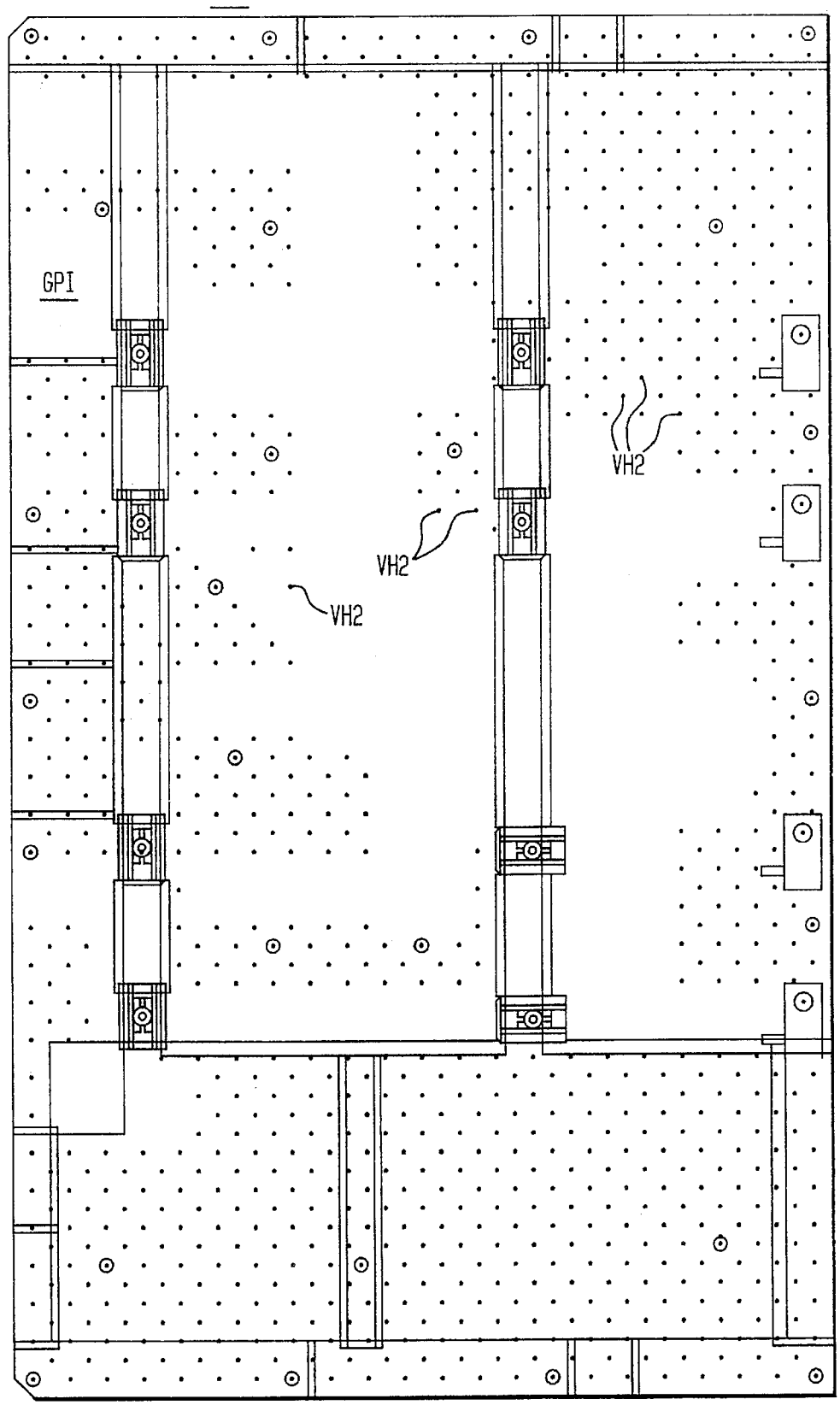
FIG. 13 is a plan view of the ground plane in the device of FIGS. 11 and 12.
Figure 14:
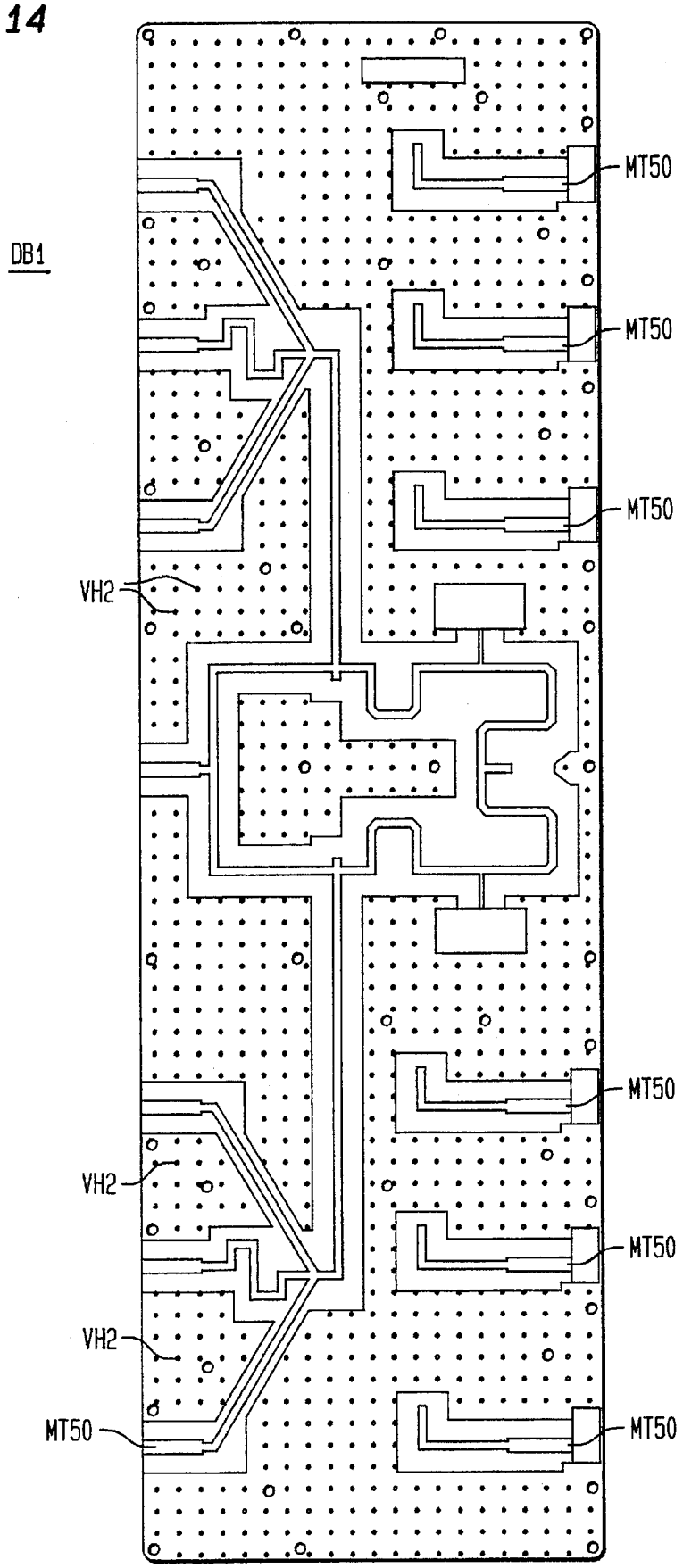
FIG. 14 is a plan view of the top board of an N-way combiner where N=6
Figure 15:
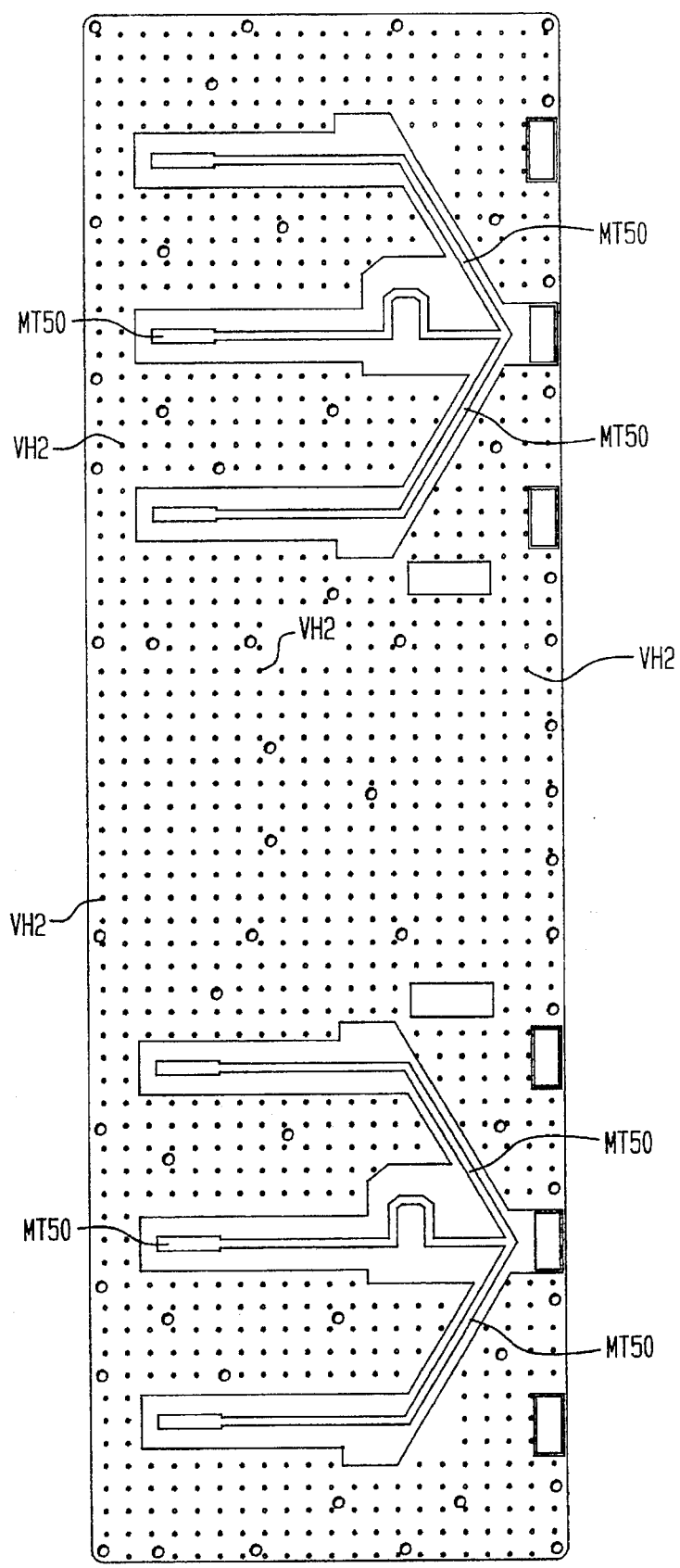
FIG. 15 is a view of the bottom board of the N-way combiner in FIG. 14.
Figure 16:
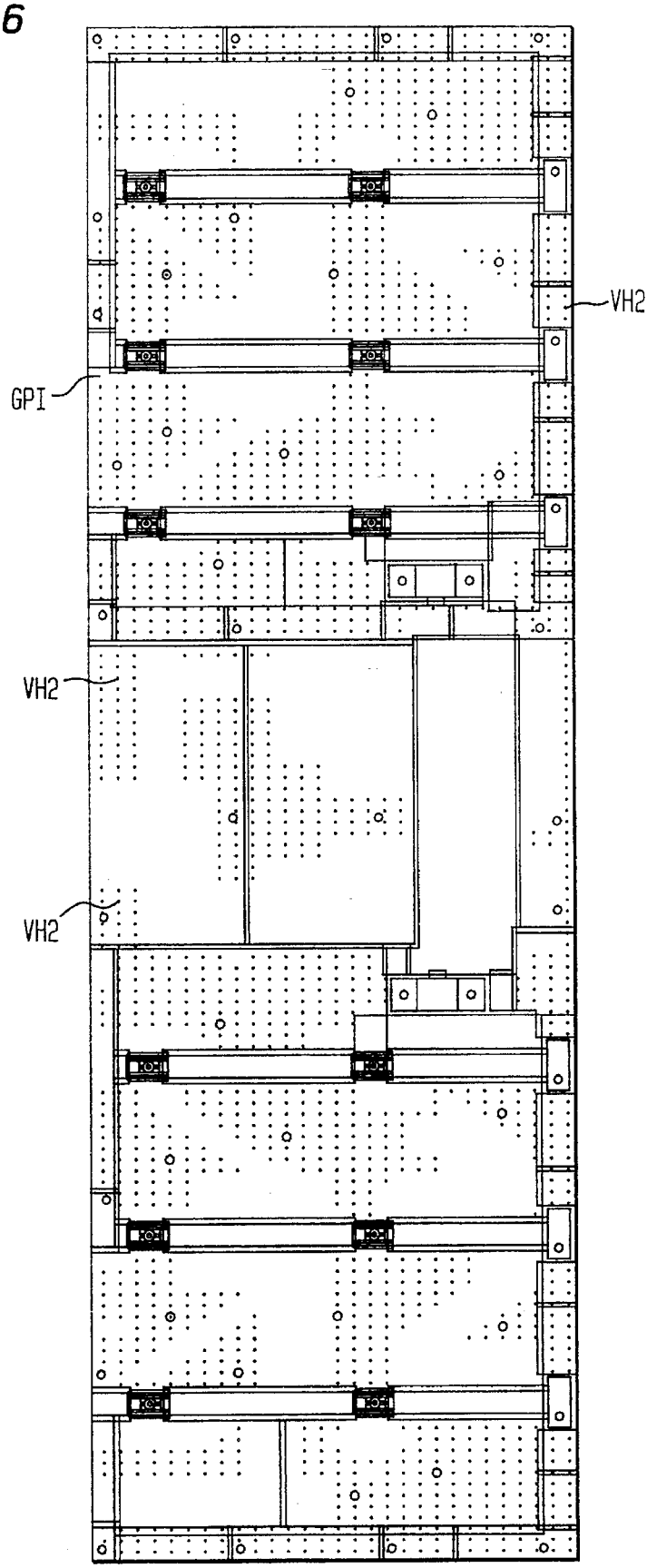
FIG. 16 is a plan view of the ground plane of the N-way combiner in FIG. 14.

FIGS. 11, 12 and 13 illustrate the traces and via holes in the top board DB1, the bottom board DB2, and the ground plane GP1 between the boards DB1 and BD2 for an N-way divider/combiner where N=4. FIGS. 14, 15 and 16 illustrate the traces and via holes in the top board DB1, the bottom board DB2, and the ground plane GP1 between the boards DB1 and BD2 for an N-way divider/combiner where N=6. The traces and via holes produce supplemental paths which cause cancellation of extraneous signals at the various input and output ports. The ground via holes form honeycombs that extend the ground plane GP1.

The invention furnishes an integral unit composed of two microstrip boards which share a common ground plane. Grounding to a middle and common ground plane occurs by way of pattern of plated through via holes. RF signal power passes from the microstrip traces on the top board to RF traces on the bottom board by plated through via holes. The unit can form a combiner or divider for an N-way system. The microstrip board stack up alleviates the line crossover problems inherent in the Gysel layout. It also obviates the need for the coaxial cable or cables of the Gysel apparatus. Copper is etched off or left off the bottom board so that both boards can share a common ground plane.

The arrangement according to the invention permits easy assembly of the PDPC (power divider/power combiner). With the multi-layer microstrip implementation, all the assembler needs to do is screw the board in the enclosure, solder the connections and terminations. This offers substantial advantages over cutting and soldering individual coaxial cables as described by Gysel.

Since the board stack up is two microstrip boards bonded together, ground shielding to the middle (common) ground plane is provided by using many plated through holes. This forms a "honey comb" like pattern on both the top and bottom boards. The ground is then transferred from the power combiners/dividers enclosure to the common ground plane.

According to an embodiment of the invention, edge plating along the edges of the boards MB1 and MB2, and in contact with the ground plane GP1 ensures that grounding to the center ground plane and good shielding effectiveness. Signal power is transferred between the top and bottom boards by using a single via hole for each interconnection.

The grounding via holes VH2, and their density is sufficient to create an effective and equal ground potential and a shielding effect around the areas of the traces. Preferably, the total horizontal area of dispersal of the ground via holes VH2 exceeds the total area uncovered by via holes. Moreover, the sum of the areas covered by the ground via holes VH2 themselves, i.e. horizontal area of each via hole VH2, times the number of ground via holes VH2, exceeds the areas of the microstrip traces by a factor of 0.85.

The ground via holes VH2 collectively form a grounded shield about the microstrip traces. This shielding affords the system operational effects similar to the effects of the outer conductor of a coaxial cable.

While embodiments of the invention have been described in detail, it will be evident to those skilled in the art that the invention may be embodied otherwise without departing from its spirit and scope.

What is claimed is:

1. An apparatus, comprising:
   a pair of dielectric boards sandwiching a ground plane between them and forming outer faces away from the ground plane;
   a plurality of microstrip traces on the outer faces;
   a plurality of openings in the ground plane; and
   a plurality of conductive ground via holes extending from said ground plane to each of said faces at locations between said microstrip traces so as to carry the potential of said ground plane.

2. An apparatus as in claim 1, further comprising a plurality of conductive signal via holes passing through the openings in the ground plane and connecting said microstrip traces on the face of one of said dielectric boards to the microstrip traces on the face of the other of said dielectric boards.

3. An apparatus as in claim 1, wherein said plurality of ground via holes form a honeycomb shape about said microstrip traces.

4. An apparatus as in claim 1, wherein said plurality of ground via holes surround said microstrip traces with a potential of said ground plane.

5. An apparatus as in claim 1, wherein said plurality of ground via holes form a ground-potential shield around said microstrip traces.

6. An apparatus as in claim 2, wherein the plurality of ground via holes exceed in number the plurality signal via holes.

7. An apparatus as in claim 1, wherein the plurality of ground via holes extend over a total area and said microstrip traces extend over a total area, the total area over which said ground via holes extends being greater than the total area over with said microstrip traces extends.

8. An apparatus as in claim 1, wherein each of the plurality of ground via holes covers a given area and said microstrip traces each covers a given area, the total of the given areas which said ground via holes cover being greater than the total of the given areas area which said microstrip traces cover.

9. An apparatus as in claim 1, wherein said boards have edges, said edges being coated with conductive material conductively connected to said ground plane.

10. An apparatus as in claim 2, wherein said microstrip traces and said signal via holes form a divider/combiner circuit.

11. An apparatus as in claim 2, wherein said microstrip traces and said signal via holes form a divider/combiner circuit having connecting input and output contacts and forming a ground contact.

12. An apparatus as in claim 3, wherein said microstrip traces and said signal via holes form a divider/combiner circuit having connecting input and output contacts and forming a ground contact.

13. An apparatus as in claim 2, wherein said microstrip traces and said signal via holes form a divider/combiner circuit having connecting input and output contacts and forming a ground contact; and
   a conductive grounding casing surrounding and supporting said dielectric boards and having a plurality of input/output ports connected to said input and output contacts and said casing being connected to said ground contact.

14. An apparatus as in claim 13, further comprising:
   a second pair of dielectric boards sandwiching a second ground plane between them and forming second outer faces away from the ground plane;
   a second plurality of microstrip traces on the second outer faces;
   a second plurality of openings in the second ground plane;
   a second plurality of conductive signal via holes passing through the second openings in the second ground plane and connecting said microstrip traces on the face of one of said second boards to the microstrip traces on the face of the other of said second boards; and
   a second plurality of conductive ground via holes extending from said second ground plane to each of said second faces at locations between said second microstrip traces so as to carry the potential of said second ground plane;
   said second microstrip traces and said second signal via holes form a divider/combiner circuit having second connecting input and output contacts and forming a ground contact;
   said conductive grounding casing further surrounding and supporting said second dielectric boards and having a plurality of second input/output ports connected to said second input and output contacts and said casing being connected to said second ground contact.

15. An apparatus as in claim 14, wherein said pair of dielectric boards with said microstrip lines and said ground via holes and said signal via holes form a pair of microstrip boards; and
   further comprising a plurality of amplifiers connecting the input and output connectors of said first pair of microstrip boards to input and output connectors on the second of said microstrip boards.

16. A method, comprising the following steps in any sequence:
   sandwiching a ground plane between a pair of dielectric boards so as to form outer faces away from the ground plane;
   forming a plurality of microstrip traces on the outer faces;
   forming a plurality of openings in the ground plane;
   forming a plurality of conductive signal via holes passing through the openings in the ground plane
   connecting said microstrip traces on the face of one of said boards to the microstrip traces on the face of the other of said boards with said signal via holes; and
   forming a plurality of conductive ground via holes extending from said ground plane to each of said faces at locations between said microstrip traces so as to carry the potential of said ground plane.

17. A method as in claim 16, wherein the step of sandwiching the ground plane includes:
   forming each of said dielectric boards with a conductive planes on opposite faces;
   etching off one of the conductive planes on one of the dielectric boards to leave a bare face; and adhesively attaching a conductive plane on the other of said dielectric boards to the bare face.

18. A method as in claim 17, wherein the step of forming said microstrip lines includes etching said conductive planes.

19. A method as in claim 16, wherein the step of forming said ground via holes and said signal via holes includes forming openings and plating said openings with conductive materials.

20. A method as in claim 16, further comprising connecting said microstrip traces to signal sources and loads, and connecting said ground plane to a grounding casing.

* * * * *